(12) United States Patent
Yang et al.

(10) Patent No.: US 10,139,822 B2
(45) Date of Patent: Nov. 27, 2018

(54) UNMANNED AERIAL VEHICLES

(71) Applicant: ZEROTECH (Shenzhen) Intelligence Robot Co., Ltd., Shenzhen (CN)

(72) Inventors: Jianjun Yang, Beijing (CN); Hao Wang, Beijing (CN); Yi Jia, Beijing (CN); Jun Li, Beijing (CN)

(73) Assignee: ZEROTECH (SHENZHEN) INTELLIGENCE ROBOT CO., LTD., Longgang District, Shenzhen (CN)

(*) Notice: Subject to any disclaimer, the term of this patent is extended or adjusted under 35 U.S.C. 154(b) by 202 days.

(21) Appl. No.: 15/141,835

(22) Filed: Apr. 29, 2016

(65) Prior Publication Data
US 2017/0192430 A1   Jul. 6, 2017

(30) Foreign Application Priority Data

| Jan. 5, 2016 | (CN) | ................ 2016 1 0007072 |
| Jan. 5, 2016 | (CN) | ................ 2016 2 0008758 |
| Jan. 5, 2016 | (CN) | ................ 2016 2 0010272 |
| Jan. 5, 2016 | (CN) | ................ 2016 2 0010286 |
| Jan. 5, 2016 | (CN) | ................ 2016 2 0010328 |

(51) Int. Cl.
| G05D 1/00 | (2006.01) |
| B64C 39/02 | (2006.01) |
| B64D 47/08 | (2006.01) |
| H04N 5/232 | (2006.01) |
| B64D 31/06 | (2006.01) |
| H05K 1/14 | (2006.01) |
| H05K 1/18 | (2006.01) |
| H05K 3/36 | (2006.01) |

(52) U.S. Cl.
CPC ......... *G05D 1/0088* (2013.01); *B64C 39/024* (2013.01); *B64D 31/06* (2013.01); *B64D 47/08* (2013.01); *G05D 1/0038* (2013.01); *G05D 1/0094* (2013.01); *H04N 5/23254* (2013.01); *H04N 5/23258* (2013.01); *H04N 5/23261* (2013.01); *H04N 5/23267* (2013.01); *H05K 1/141* (2013.01); *H05K 1/18* (2013.01); *H05K 3/36* (2013.01); *B64C 2201/127* (2013.01); *B64C 2201/141* (2013.01); *B64C 2201/146* (2013.01)

(58) Field of Classification Search
CPC .. G05D 1/0088; G05D 1/0038; G05D 1/0094; B64C 39/024; B64C 2201/127; B64C 2201/141; B64C 2201/146; B64D 47/08; H04N 5/23254; H04N 5/23267
USPC .......................................................... 701/2
See application file for complete search history.

(56) References Cited

U.S. PATENT DOCUMENTS

| 5,581,250 A * | 12/1996 | Khvilivitzky ........... G01S 11/12 340/945 |
| 2007/0093945 A1 * | 4/2007 | Grzywna ............... G05D 1/101 701/23 |

(Continued)

*Primary Examiner* — Anne M Antonucci
*Assistant Examiner* — James E Stroud
(74) *Attorney, Agent, or Firm* — Jun He Law Offices P.C.; James J. Zhu

(57) ABSTRACT

An unmanned aerial vehicle (UAV) includes an image capturing module disposed on the UAV, and configured to capture image data; and a controller chip coupled to the image capturing module to receive and process the image data; and the controller chip being configured to control the flight of the UAV.

14 Claims, 3 Drawing Sheets

(56) References Cited

U.S. PATENT DOCUMENTS

| | | | |
|---|---|---|---|
| 2010/0013927 A1* | 1/2010 | Nixon | G01C 11/06 |
| | | | 348/144 |
| 2011/0017863 A1* | 1/2011 | Goossen | F41G 7/303 |
| | | | 244/3.14 |
| 2016/0218223 A1* | 7/2016 | Nomura | H01L 29/66969 |

* cited by examiner

UNMANNED AERIAL VEHICLES

CROSS REFERENCE TO RELATED APPLICATIONS

This application claims priority from Chinese Application Serial Number 201610007072.8, filed on Jan. 5, 2016; Chinese Application Serial Number 201620010286.6, filed on Jan. 5, 2016; Chinese Application Serial Number 201620008758.4, filed on Jan. 5, 2016; Chinese Application Serial Number 201620010328.6, filed on Jan. 5, 2016; Chinese Application Serial Number 201620010272.4, filed on Jan. 5, 2016, the entire content of which is incorporated herein by reference.

TECHNICAL FIELD

The present application relates to unmanned aerial vehicle technology, and more particularly to unmanned aerial vehicles having a compact structure by certain integrated design/implementation.

BACKGROUND

An unmanned aerial vehicle (UAV), also referred to as an unmanned drone or drone, is an aircraft that does not carry a human operator and is typically remotely piloted by an external operator on the ground. The typical UAVs are usually deployed for military, civilian and special operation applications such as policing, scientific research or inspection of security dangers, etc.

FIG. 1 shows a conventional UAV 100. As shown in FIG. 1, the UAV 100 has a flight control module 101, a motion detecting module 102, an electronic speed control (ESC) module 103, a camera platform 104 and a wireless communication module 105. The camera platform 104 is used to mount a camera 108. For example, in order to get desired image or video, the camera 108 might be adjusted via two motors of the camera platform 104 that allows two-dimensional movement of the camera 108. The camera platform 104 further includes therein a platform control module 107 which is used to control the motors and process image data acquired through the camera 108. However, the camera platform 104 is generally bulky and heavy, which increases the safety risk of operating the UAV and power consumption of the UAV.

Thus, there is a need for further improvement of the UAVs.

SUMMARY

An objective of the present application is to provide a UAV with a compact structure.

In an aspect of the present application, there is disclosed a UAV including: an image capturing module disposed on the UAV, and configured to capture image data; and a controller chip coupled to the image capturing module to receive and process the image data; and the controller chip is configured to control the flight of the UAV.

The controller chip has features of high integration and expansibility, which significantly simplifies the circuit structure of the UAV of the present application. Furthermore, as the controller chip can process the captured image data for purpose of image stabilization or other purposes, a physical camera platform that enables the movement of the image capturing module relative to a main body of the UAV is not required, and a platform control module is unnecessary either. Thus, the UAV of the present application is compact in structure and light in weight, which further reduces the cost of production and power consumption.

The foregoing has outlined, rather broadly, features of the present application. Additional features of the present application will be described, hereinafter, which form the subject of the claims of the present application. It should be appreciated by those skilled in the art that the conception and specific embodiments disclosed herein may be readily utilized as a basis for modifying or designing other structures or processes for carrying out the objectives of the present application. It should also be realized by those skilled in the art that such equivalent constructions do not depart from the spirit and scope of the present application as set forth in the appended claims.

BRIEF DESCRIPTION OF THE DRAWINGS

The aforementioned features and other features of the present application will be further described in the following paragraphs by referring to the accompanying drawings and the appended claims. It will be understood that, these accompanying drawings merely illustrate certain embodiments in accordance with the present application and should not be considered as limitation to the scope of the present application. Unless otherwise specified, the accompanying drawings need not be proportional, and similar reference characters generally denote similar elements.

DETAILED DESCRIPTION OF THE PREFERRED EMBODIMENTS

The following detailed description refers to the accompanying drawings as a part of the present application. Unless otherwise stated in the context, similar symbols generally represent similar components in the accompanying figures. The illustrative embodiments described in the detailed description, the accompanying drawings and the claims are not limiting, and other embodiments may be adopted, or modifications may be made without deviating from the spirit and subject of the present application. It should be understood that, the various aspects of the present application described and graphically presented herein may be arranged, replaced, combined, divided and designed in many different configurations, and these different configurations are implicitly included in the present application.

Figure 2:
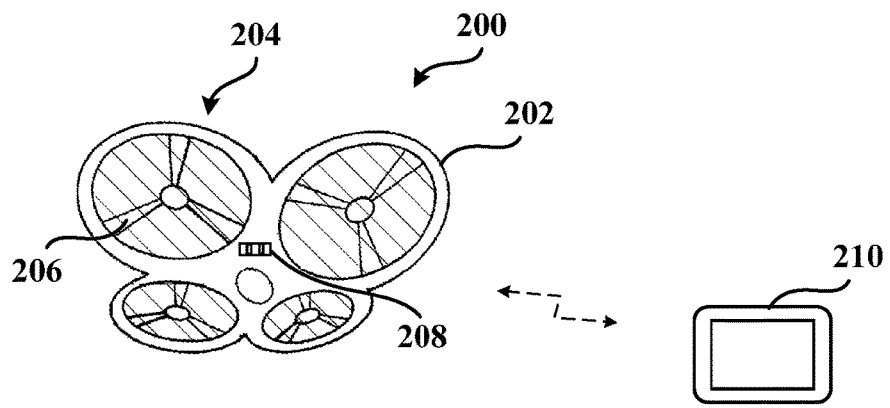
FIG. 2 shows a UAV according to an embodiment of the present application.

FIG. 2 shows a UAV 200 according to an embodiment of the present application.

As shown in FIG. 2, the UAV 200 can be an unmanned drone of a small dimension, such as a four-disc UAV. The UAV 200 has a body 202 and a rotor assembly 204 that drives the movement of the body 202, and rotor discs 206 of the rotor assembly 204 control the lift and torque of the body 202, thereby moving the body 202 in a desired direction and at a desired speed.

The UAV 200 further includes an image capturing module 208 disposed on the body 202. The image capturing module 208 may be a camera, which is used to capture and generate image data, for example, of an environment or space in which the UAV 200 resides or of an object in the environment or space. Alternatively, the image capturing module 208 may be other types of image sensing devices with optical-to-electronic conversion functionality.

The UAV 200 may be in wireless communication with a remote terminal 210 external to the UAV 200 and operated by an operator. In some embodiments, the remote terminal 210 may be a mobile phone or a tablet computer with wireless communication and data processing functionality. With the remote terminal 210, the operator can give various control instructions to control the flight of the UAV 200, as well as other actions or operations of the UAV 200. Furthermore, the operator may view pictures or videos generated from the image data transmitted from the UAV 200 using a display of the remote terminal 210.

Figure 3:
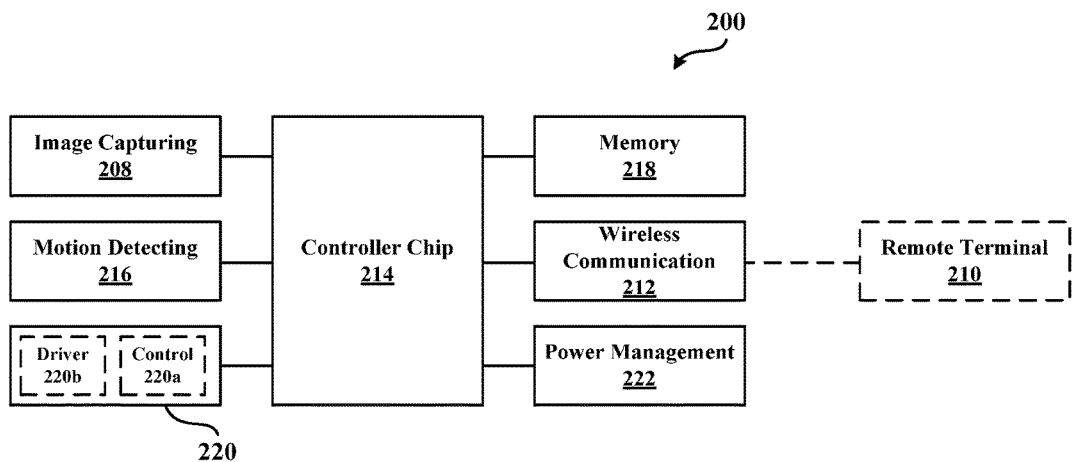
FIG. 3 shows a block diagram of the UAV shown in FIG. 2.

FIG. 3 shows a more detailed block diagram of the UAV 200 shown in FIG. 2 according to one embodiment of the present invention.

The UAV 200 includes a wireless communication module 212 for communicating data and instruction(s) between the UAV 200 and the remote terminal 210. Specifically, the wireless communication module 212 may receive control instructions from the remote terminal 210, and transmit to the remote terminal 210 various data and information such as flight-related information of the UAV 200. The wireless communication module 212 may be a wireless fidelity (WiFi) module, a mobile communication module, such as 3G 4G mobile communication module, a Bluetooth device, an infra-red communication module, or other similar wireless communication modules.

In some other embodiments, the UAV 200 may fly automatically and independent from the remote terminal. For example, the UAV 200 may pre-store a navigation path in a memory module, which may be preconfigured by the operator. Accordingly, the UAV 200 may read the pre-stored navigation path from the memory module, such that the flight of the UAV can be controlled based on the pre-stored navigation path. Specifically, specific flight control instructions such as moving along a direction with respect to the UAV, or rotating about an axis of the UAV, may be generated based on the navigation path and the position of the UAV in real time, so that the motors and other flight related components of the UAV may be controlled by the generated flight control instructions.

In still further embodiments, the UAV 200 may track a target based on a predetermined algorithm or pre-stored instructions, rather than the flight control instructions transmitted from the remote terminal in real time. Specifically, the UAV 200 may process the image data acquired by the image capturing module 208, and identify characteristic information of a target to be tracked. For example, the characteristic information may be the shape, size, color, texture or image pattern of the target. The UAV 200 may identify the target and its characteristic information using a predetermined image recognition algorithm. Accordingly, the UAV 200 may generate flight control instructions to track the target, for example, to keep the target within a predefined scope of the image acquired by the image capturing module 208. In this way, the UAV may further fly automatically or semi-automatically according to the generated flight control instructions.

It should be noted that the above flight control manners of the UAV are not intended to be construed a limitation, and any other manners for controlling the flight of the UAV may be applied to the UAV according to embodiments of the present application.

As shown in FIG. 3, the UAV 200 includes the image capturing module 208. Preferably, the image data acquired by the image capturing module 208 can be transmitted to the remote terminal 210 by the wireless communication module 212.

The UAV 200 further includes a controller chip 214 functioning as a central processing component of the UAV 200. The controller chip 214 is coupled to the image capturing module 208 to receive the captured image data, such as static or video image data.

In the present invention, the controller chip 214 can process the image data based on image signal processing algorithm(s) pre-configured in the controller chip 214. The image signal processing may include, without limitation, automatic white balance, automatic exposure, gain control, noise reduction, gamma correction, image sharpening and etc. The image signal processing improves the quality of images generated from the image data, thereby improving user experience of the UAV 200.

The controller chip 214 may further perform image stabilization on the image data. The image stabilization is used to reduce blurring associated with the motion of the image capturing module 208 during exposure, or reduce visible frame-to-frame jitter in the video image data caused by shake of the image capturing module 208. The image stabilization performed by the controller chip 214 is electronic image stabilization that can compensate for pan or tilt of the image capturing module 208, which is different from the mechanical stabilization performed by a physical camera platform of a conventional UAV such as the UAV 100 shown in FIG. 1.

Figure 1:
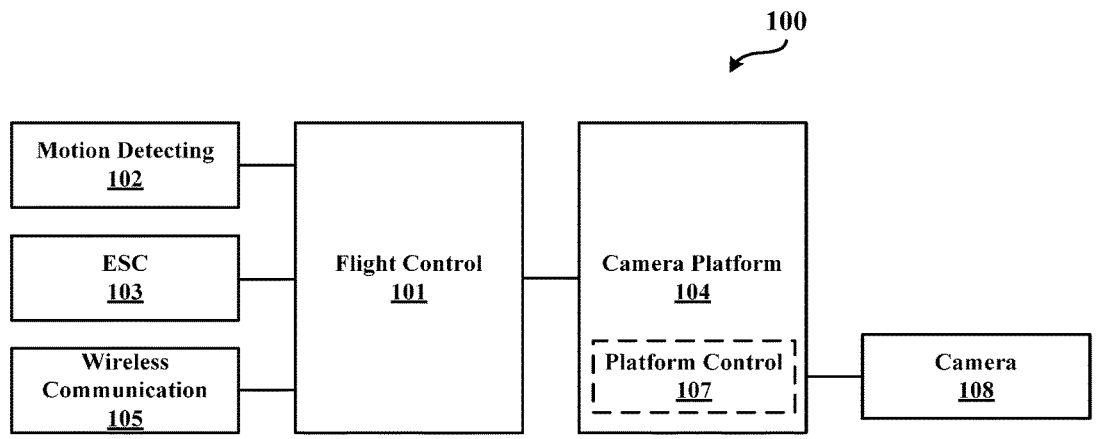
FIG. 1 shows a conventional UAV.

Thus, unlike the configuration of FIG. 1, the camera platform with image processing functionality, especially image stabilization functionality, is no longer necessary for the UAV 200 in FIG. 3.

In the embodiment shown in FIG. 3, the UAV 200 further includes a motion detecting module 216 coupled to the controller chip 214, which is used to detect the motion status of the UAV 200 and generate one or more motion parameters indicative of the detected motion status of the UAV 200. For example, the motion detecting module 216 may include an inertial measurement sensor, an altitude sensor, a positioning sensor, a distance sensor, an ultrasound transducer, an infrared sensor, an optical sensor, and any other suitable motion detecting devices. The motion parameters of the UAV 200 may include, without limitation, a position, altitude, velocity, speed, acceleration or orientation of the UAV 200, or a change in position, altitude, velocity, speed, acceleration or orientation of the UAV 200. The detected motion status of the UAV 200 may be transmitted to the controller chip 214 for subsequent processing. The detected motion status or the motion parameters may be transmitted to the controller chip 214 directly. Alternatively, a microcontroller unit (MCU) (not shown in FIG. 3) may collect the motion parameters from the sensors of the motion detecting module 216, and then transmit them to the controller chip 214. In some embodiments, the UAV 200 may further transmit the detected motion status to the remote terminal 210, so that the operator can view the status of the UAV through a display of the remote terminal 210.

Specifically, the controller chip 214 may use the detected motion status to perform image stabilization on the image data. For example, with the motion detecting module 216, the UAV 200 may detect its change in position when a first frame and a second frame of the video image data are acquired. The controller chip 214 may then convert such position change into a motion vector in a coordinate system referenced to the frames of the video image data, for example, using the controller chip 214. Next, the controller chip 214 may offset the motion vector in the frames of the video image data, so as to generate modified frames in which the position change has been compensated. In some other embodiments, the detected motion status is used to control the UAV flight, either automatically or responsive to flight control instructions received from the remote terminal 210.

As mentioned above, the UAV 200 receives control instructions such as the flight control instructions from the remote terminal 210. The flight control instruction may pilot and control the flight of the UAV 200. For example, the flight control instruction may instruct the UAV 200 to fly to a destination position, to fly back to an original position, or increase or decrease its moving speed.

The control instructions may also be related to the capturing or processing of the image data. For example, the control instruction may instruct the controller chip 214 to manage the image data, such as save data into or delete data from a memory module 218. Furthermore, the control instruction may instruct the image capturing module 208 to start or stop the capturing of image data, to set the mode of the image capturing mode 208 as static image capturing mode or video image capturing mode, or to configure image capturing parameters such as resolution or frame rate.

In some embodiments, the controller chip 214 may further save the control instructions received from the remote terminal 210, for example, into the memory module 218. Accordingly, the stored control instructions can be retrieved when a flight accident happens, for example, so as to determine whether such accident is caused by misconduct of the operator. The controller chip 214 may also implement the automatic flight of the UAV as described above, for example, by integrating therewith corresponding flight control instructions, algorithms, software programs or the like.

Still referring to FIG. 3, the UAV 200 may further include a rotor control module 220 coupled to the controller chip 214. The rotor control module 220 is used to, under the control of the controller chip 214, control and monitor the operation of rotors of the UAV 200 and/or transmit operation parameters of the rotors to the controller chip 200.

In some embodiments, the rotor control module 220 may include a control unit 220a for receiving rotor control instructions from the controller chip 214, so as to turn on or turn off the rotors or to adjust the speed of the rotors. Furthermore, the control unit 220a may also monitor and detect the operation status of the rotors, and generate operation parameters such as voltage, current, rotary speed or other parameters of the rotors. In some alternative embodiments, the control unit 220a may be integrated within the controller chip 214. The rotor control module 220 may further include a driver unit 220b for providing driving voltages to the rotors.

In a preferred embodiment, the controller chip 214 may be a system on chip (SOC) integrated chip that integrates various components of a data processing system or other electronic system into a single chip. For example, the controller chip 214 may be one of an advanced RISC machine (ARM) processor, a digital signal processor (DSP) or a Field Programmable Gate array (FPGA).

An example of the controller chip 214 is Innopower® LC1860C chip provided by Leadcore Technology Co. Ltd. It can be readily appreciated by people skilled in the art that other commercially available SOC chips can be used. Specifically, the Innopower® LC1860C chip has various types of interfaces for connection with the foregoing modules of the UAV 200. For example, the rotor control module 220 may be connected to the chip via a Universal Asynchronous Receiver/Transmitter (UART) interface, the image capturing module 208 may be connected to the chip via a Mobile Industry Processor Interface (MIPI) interface or a Universal Serial Bus (USB) interface, the wireless communication module 212 may be connected to the chip via a USB interface or a Secure Digital Input and Output (SDIO) interface, and the motion detecting module 216 may be connected to the chip via a USB interface as well.

In a preferred embodiment, the UAV 200 may further include a specialized power management module 222 coupled to the controller chip 214 and/or to other circuit modules such as the image capturing module 208, the wireless communication module 212, the motion detecting module 216, the memory module 218 and/or the rotor control module 220. The power management module 222 can generate and provide supply voltages of different voltage levels to different modules of the UAV 200. By replacing the conventional discrete power supply modules such as buck converters and low dropout regulators (LDOs), one unified power management module 222 improves the integration of the UAV 200 and reduces the power consumption of the UAV 200.

In certain embodiments, all the circuit modules of the UAV 200 can be mounted on a printed circuit board (PCB), which can be carried on the body of the UAV 200. In some alternative embodiments, the circuit modules UAV 200 can be mounted on two separate PCBs. For example, the controller chip 214 and/or the power management module 222 may be mounted on a primary PCB, and the motion detecting module 216, the image capturing module 208 and a wireless communication module 212 may be mounted on a secondary PCB. In this configuration, the UAV designer may just need to modify the design of the secondary PCB if merely certain modules (e.g. the image capturing module or the motion detecting module) on the secondary PCB needs replacement or upgrades.

It can be seen that the high integration and expansibility of the controller chip 214 significantly simplifies the circuit structure of the UAV 200. Furthermore, the image capturing module 208 can be directly connected to the controller chip 214 which then processes the captured image data for purpose of image stabilization. Thus, a camera platform 104 as shown in FIG. 1 that enables the movement of the image capturing module relative to a main body of the UAV is not required, and a platform control module 107 of FIG. 1 is unnecessary either. Thus, the UAV 200 may be compact in structure and light in weight, which further reduces the cost of production and power consumption of the UAV 200.

Figure 4:
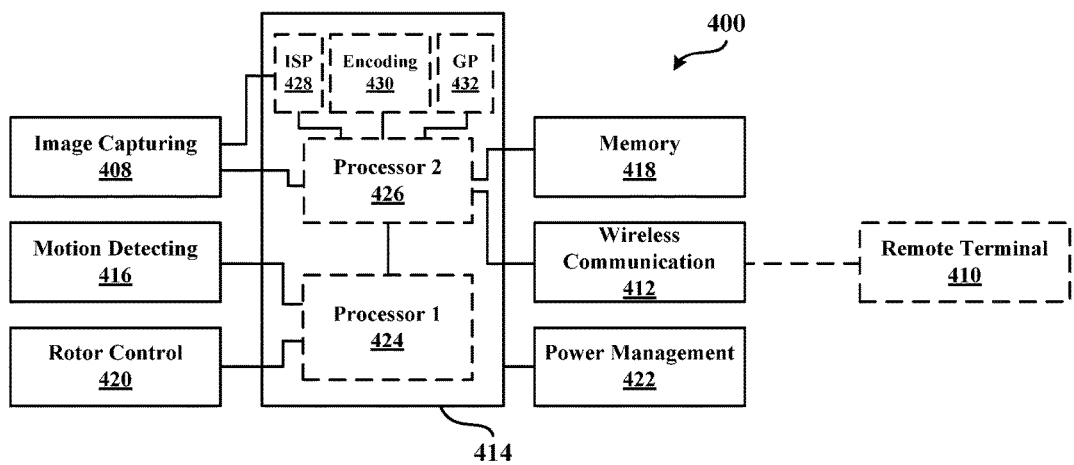
FIG. 4 shows a block diagram of a UAV according to another embodiment of the present application.

FIG. 4 shows a block diagram of a UAV 400 according to another embodiment of the present application.

As shown in FIG. 4, the UAV 400 includes a controller chip 414. In the embodiment, the controller chip 414 has a first processor 424 and a second processor 426.

The first processor 424 is used to control the flight of the UAV, and the second processor 426 is used to process image data generated by an image capturing module 408. Preferably, the first processor 424 and the second processor 426 may be coupled with each other to communicate data and instructions therebetween.

The first processor 424 and the second processor 426 may be implemented with the same hardware structure, or be implemented with different hardware structures. For example, the first processor 424 may be a DSP module, and the second processor 426 may be an ARM processor. Alternatively, the first processor 424 may be a single-core ARM processor, and the second processor 426 may be a four-core ARM processor; or the first processor 424 may be a four-core ARM processor, and the second processor 426 may be a single-core ARM processor. Additionally, one or both the first processor 424 and the second processor 426 may be an ARM processor, a DSP, a field programmable gate array (FPGA), a complex programmable logic device (CPLD) or any other suitable signal and data processing modules.

Various peripheral circuit modules may be coupled to the controller chip 414 via interfaces of the controller chip 414. Specifically, the UAV 400 has a motion detecting module 416 for detecting the motion status of the UAV 400, and the first processor 424 is coupled to the motion detection module 416 to receive the detected motion status of the UAV 400. Furthermore, the first processor 424 is coupled to a wireless communication module 412, either directly or via the second processor 426, to receive flight control instructions transmitted from a remote terminal 410. Accordingly, the first processor 424 can control the flight of the UAV 400 based on the flight control instruction and/or the detected motion status of the UAV 400. The first processor 424 may transmit flight control signals to a rotor control module 420 and/or other flight-related modules such as a piloting module (not shown), so as to control the operation of the rotors.

As mentioned above, the second processor 426 may be used to process the image data. Accordingly, the image capturing module 408 is coupled to the second processor 426, for example, directly connected to the second processor 426 via a MIPI interface or a USB interface. The second processor 426 may receive and process the image data by itself, or with other circuit modules.

In the embodiment shown in FIG. 4, the controller chip 414 has three additional modules for processing the image data, which are described below.

Specifically, an image signal processing (ISP) module 428 may be coupled between the image capturing module 408 and the second processor 426. The ISP module 428 may receive the image data from the image capturing module 408, and perform image signal processing on the image data. The image signal processing may include, without limitation, automatic white balance, automatic exposure, gain control, noise reduction, gamma correction, image sharpening and etc. The image signal processing may further include format conversion of the image data. For example, the format of the image data captured by the image capturing module 408 may be RAW9/11/12, and the ISP module 428 may convert the format of the image data from RAW9/11/12 to YUV420/YUV422/YUYV or other format(s), and then perform other types of signal processing on the converted image data. Furthermore, an encoding module 430 is coupled to the second processor 426.

Inside the controller chip 414, an encoding module 430 is provided to encode the image data in a predetermined data format. For example, the encoding module 430 may receive the YUV420/YUV422/YUYV image data, and convert it into other formats, e.g. video formats such as H264/263, AVI or MP4, or picture formats such as JPEG, BMP, PNG or GIF. The encoded image data can be transmitted to the second processor 426, and then be saved into a memory module 418 of the UAV 400 or transmitted to the remote terminal 410. In some embodiments, the encoding module 430 may also have decoding functionality to decode data encoded with the same or similar instructions or algorithms. Alternatively, a decoding module (not shown) may be included within the UAV.

Inside the controller chip 414, a graphic processing (GP) module 432 is provided and coupled to the second processor 426. The GP module 432 can be used to perform image stabilization on the image data, so as to reduce blurring associated with the motion of the image capturing module 408 during exposure, or reduce visible frame-to-frame jitter in the video image data caused by shake of the image capturing module 408. The electronic image stabilization performed by the GP module 432 can compensate for pan or tilt of the image capturing module 408, and thus, a camera platform with image stabilization functionality as shown in FIG. 1 is not required for the UAV 400 of FIG. 4. Preferably, the GP module 432 may receive the detected motion status of the UAV 400 from the second processor 426, and perform the image stabilization on the image data based on the detected motion status of the UAV 400. In some alternative embodiments, the ISP module 428, the encoding module 430 and/or the GP module 432 maybe integrated within the second processor 426.

Figure 5:
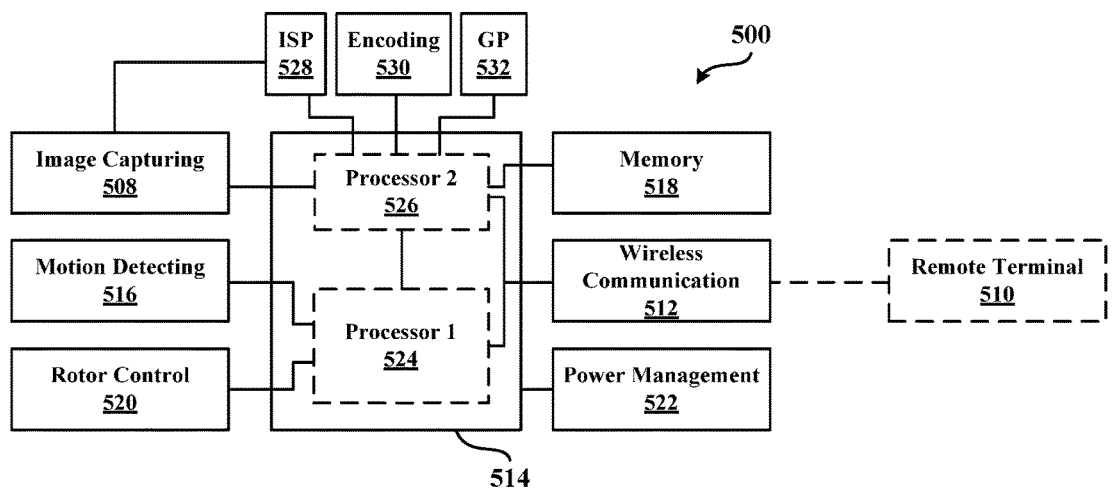
FIG. 5 shows a block diagram of a UAV according to another embodiment of the present application.

FIG. 5 shows a block diagram of a UAV 500 according to another embodiment of the present application.

As shown in FIG. 5, the UAV 500 has a controller chip 514. The UAV 500 further includes an ISP module 528, an encoding module 530 and a GP module 532 coupled to the controller chip 514, instead of being integrated into the controller chip 514 as shown in FIG. 4. The other peripheral circuit modules of the UAV 500, including an image capturing module 508, a wireless communication module 512, a motion detecting module 516, a memory module 518, a rotor control 520 and a power management module 522, are similar to the corresponding modules shown in FIGS. 3 and 4, which are not elaborated herein.

The embodiments of the present application may be implemented by hardware, software or any combination thereof. The hardware may be implemented by specific logic circuits, and the software may be stored in a memory and executed by appropriate instruction executing systems. For example, the software may be executed by a microprocessor or a specifically designed hardware.

Those skilled in the art may understand and implement other variations to the disclosed embodiments from a study of the drawings, the present application, and the appended claims. In the claims, the word "comprising" does not exclude other elements or steps, and the indefinite article "a" or "an" does not exclude a plurality. In applications according to present application, one element may perform functions of several technical feature recited in claims. Any reference signs in the claims should not be construed as limiting the scope. The scope and spirit of the present application is defined by the appended claims.

What is claimed is:

1. An unmanned aerial vehicle (UAV), comprising:
    an image capturing module disposed on the UAV, configured to capture image data; and
    a controller chip coupled to the image capturing module to receive and process the image data, and the controller chip being configured to control the flight of the UAV;
    a primary printed circuit board (PCB) on which the controller chip is mounted;
    a secondary PCB on which the image capturing module is mounted;
    a motion detecting module coupled to the controller chip and mounted on the secondary PCB, wherein the motion detecting module is configured to detect motion status of the UAV and transmit to the controller chip the detected motion status of the UAV;
    an image signal processing module coupled between the image capturing module and the controller chip, and configured to receive the image data from the image capturing module to perform image signal processing on the image data, and transmit the processed image data to the controller chip, wherein the image signal processing module is disposed outside the controller chip;

an encoding module coupled to the controller chip, and configured to encode the image data in a predetermined video or picture format, wherein the encoding module is disposed outside the controller chip; and a graphic processing module coupled to the controller chip, wherein the graphic processing module is disposed outside the controller chip and is configured to perform image stabilization on the image data based on the detected motion status of the UAV.

2. The UAV of claim 1, wherein the controller chip further comprises:
a first processor configured to receive a flight control instruction and control the flight of the UAV based on the flight control instruction; and
a second processor configured to receive and process the image data.

3. The UAV of claim 1, wherein the controller chip is configured to process the image data by performing image stabilization.

4. The UAV of claim 2, wherein the first processor and the second processor are implemented with different hardware structures.

5. The UAV of claim 2, wherein the UAV further comprises a memory module, and the second processor is further configured to save the processed image data into the memory module.

6. The UAV of claim 1, wherein the image capturing module is directly connected to the controller chip.

7. The UAV of claim 6, wherein the image capturing module is directly connected to the controller via a Mobile Industry Processor Interface(MIPI) or a Universal Serial Bus (USB) interface.

8. The UAV of claim 1, wherein the controller chip is further configured to control the flight of the UAV based on a flight control instruction and the detected motion status of the UAV.

9. The UAV of claim 1, further comprising:
a power management module coupled to the controller chip and mounted on the primary PCB, and
wherein the power management module is configured to provide power supply to the controller chip.

10. The UAV of claim 1, further comprising:
a rotor control module coupled to the controller chip, and
wherein the rotor control module is configured to, under the control of the controller chip, control and monitor the operation of rotors of the UAV and/or transmit operation parameters of the rotors to the controller chip.

11. The UAV of claim 1, further comprising:
a wireless communication module, configured to communicate data and instructions between the UAV and a remote terminal external to the UAV;
wherein the wireless communication module is mounted on the secondary PCB.

12. The UAV of claim 11, wherein the controller chip is coupled to the wireless communication module and configured to receive a flight control instruction from the remote terminal via the wireless communication module, so as to control the flight of the UAV based on the flight control instruction.

13. The UAV of claim 1, further comprising a memory module for storing a pre-stored navigation path, and wherein the controller chip is coupled to the memory module to read the pre-stored navigation path such that the flight of the UAV is controlled based on the pre-stored navigation path.

14. The UAV of claim 1, wherein the controller chip is configured to process the image data to identify characteristic information of a target from the image data, and generate flight control instructions based on the identified characteristic information of the target, such the UAV flies based on the generated flight control instructions to track the target.

* * * * *